United States Patent
Park et al.

(10) Patent No.: US 9,740,032 B2
(45) Date of Patent: Aug. 22, 2017

(54) OPTICAL MODULATOR HAVING REFLECTION LAYERS

(71) Applicant: SAMSUNG ELECTRONICS CO., LTD., Suwon-si (KR)

(72) Inventors: Changyoung Park, Yongin-si (KR); Byunghoon Na, Suwon-si (KR); Yonghwa Park, Yongin-si (KR)

(73) Assignee: SAMSUNG ELECTRONICS CO., LTD., Suwon (KR)

( * ) Notice: Subject to any disclaimer, the term of this patent is extended or adjusted under 35 U.S.C. 154(b) by 0 days.

(21) Appl. No.: 15/050,911

(22) Filed: Feb. 23, 2016

(65) Prior Publication Data

US 2017/0059887 A1 Mar. 2, 2017

(30) Foreign Application Priority Data

Aug. 28, 2015 (KR) .......................... 10-2015-0121834

(51) Int. Cl.
| | | |
|---|---|---|
| *G02F 1/03* | (2006.01) | |
| *H01S 5/00* | (2006.01) | |
| *G02F 1/017* | (2006.01) | |
| *H01S 5/10* | (2006.01) | |
| *H01S 5/062* | (2006.01) | |
| *H01S 5/20* | (2006.01) | |
| *H01S 5/187* | (2006.01) | |
| *H01S 5/0625* | (2006.01) | |

(52) U.S. Cl.
CPC .......... *G02F 1/017* (2013.01); *H01S 5/06226* (2013.01); *H01S 5/1021* (2013.01);
(Continued)

(58) Field of Classification Search
CPC .... H01S 5/026; H01S 5/06256; H01S 5/0265; H01S 5/06258; H01S 5/1021; H01S 5/18302; H01S 5/18313; H01S 5/0264; H01S 5/0607; H01S 5/1039; H01S 5/18308; H01S 5/18369; H01S 5/3095; H01S 5/0085; H01S 5/0206; H01S 5/10;
(Continued)

(56) References Cited

U.S. PATENT DOCUMENTS

| | | | | |
|---|---|---|---|---|
| 4,790,635 A | * | 12/1988 | Apsley | .................... G02F 1/218 359/260 |
| 5,434,689 A | | 7/1995 | Shigeta et al. | |

(Continued)

FOREIGN PATENT DOCUMENTS

| | | |
|---|---|---|
| JP | 6-3693 A | 1/1994 |
| JP | 2007529107 A | 10/2007 |

(Continued)

OTHER PUBLICATIONS

Sung Jun Jang et al., "Highly tolerant a-Si distributed Bragg reflector fabricated by oblique angle deposition", Optical Society of America(OSA), Optical Materials Express, vol. 1, No. 3, Jul. 1, 2011, pp. 451-457.

*Primary Examiner* — Loha Ben
(74) *Attorney, Agent, or Firm* — Sughrue Mion, PLLC (57) ABSTRACT

An optical modulator is provided, including a lower reflection layer, an active layer formed on the lower reflection layer, and an upper reflection layer formed on the active layer. The active layer includes a multiple quantum well structure including a quantum well layer and a quantum barrier layer. The upper reflection layer includes a dielectric material. A plurality of micro cavity layers are included in the upper reflection layer.

20 Claims, 8 Drawing Sheets

(52) U.S. Cl.
CPC ............ *H01S 5/1042* (2013.01); *H01S 5/187* (2013.01); *H01S 5/20* (2013.01); *H01S 5/2013* (2013.01); *G02F 2201/346* (2013.01); *G02F 2201/38* (2013.01); *G02F 2202/101* (2013.01); *G02F 2203/11* (2013.01); *H01S 5/06256* (2013.01); *H01S 5/10* (2013.01)

(58) Field of Classification Search
CPC .. H01S 5/1025; H01S 5/1042; H01S 5/18361; H01S 5/18377; H01S 5/18397; H01S 5/187; H01S 5/20; H01S 5/2013; H01S 5/2018; H01S 3/04; H01S 3/082; H01S 3/0813; G02F 1/01; G02F 1/017; G02F 1/01725; G02F 1/03; H01L 29/12
USPC ....... 359/237, 238, 247–249, 260, 263, 578, 359/584, 586, 588, 589; 372/46.012, 372/50.1, 46.01, 43.01, 39, 50.124, 45.01, 372/50.11, 97–99; 257/14, 17, 35, 78, 257/85, 93, 94, 98; 438/29, 31, 32, 41
See application file for complete search history.

(56) References Cited

U.S. PATENT DOCUMENTS

| | | | | |
|---|---|---|---|---|
| 6,611,539 | B2 * | 8/2003 | Ledentsov | H01S 5/18302 372/109 |
| 6,618,414 | B1 * | 9/2003 | Wasserbauer | H01S 5/18358 372/45.01 |
| 7,075,954 | B2 * | 7/2006 | Ledentsov | H01S 5/18302 372/109 |
| 7,369,583 | B2 * | 5/2008 | Ledentsov | H01S 5/0607 372/102 |
| 7,580,595 | B1 * | 8/2009 | Bimberg | B82Y 20/00 385/132 |
| 7,974,328 | B2 * | 7/2011 | Suzuki | H01S 5/06226 372/45.01 |
| 8,249,121 | B2 * | 8/2012 | Brenner | H01S 5/1021 372/46.01 |
| 8,660,161 | B2 * | 2/2014 | Brenner | H01S 5/1021 372/46.01 |
| 8,804,226 | B2 * | 8/2014 | Lee | G02F 1/017 216/24 |
| 9,082,909 | B2 * | 7/2015 | Cho | H01L 31/03520 |
| 9,190,545 | B2 * | 11/2015 | Cho | H01L 31/03523 |
| 2006/0163585 | A1 | 7/2006 | Ando et al. | |
| 2010/0034233 | A1 | 2/2010 | Suzuki et al. | |
| 2010/0213495 | A1 | 8/2010 | Shum | |
| 2012/0230360 | A1 | 9/2012 | Higuchi | |
| 2015/0160481 | A1 * | 6/2015 | Park | G02F 1/017 348/47 |
| 2015/0286078 | A1 * | 10/2015 | Cho | G02F 1/01725 359/263 |

FOREIGN PATENT DOCUMENTS

| | | |
|---|---|---|
| KR | 1020050001858 A | 1/2005 |
| KR | 1020120131821 A | 12/2012 |
| WO | 2008114707 A1 | 9/2008 |

* cited by examiner

OPTICAL MODULATOR HAVING REFLECTION LAYERS

CROSS-REFERENCE TO RELATED APPLICATION

This application claims the benefit of Korean Patent Application No. 10-2015-0121834, filed on Aug. 28, 2015, in the Korean Intellectual Property Office, the disclosure of which is incorporated herein in its entirety by reference.

BACKGROUND

1. Field

Apparatuses consistent with the present disclosure relate to optical modulators, and more particularly, to optical modulators having reflection layers.

2. Description of the Related Art

In the current market for display devices, three-dimensional (3D) photographing and 3D display are considered to be hot issues, and have been utilized in various fields and in conjunction with various devices such as sensors and game consoles.

Unlike a stereo-type 3D image generation method, a 3D image generation method uses distance as depth information, and accordingly, may be used in conjunction with precise measurement devices or sensors, as well as with 3D displays.

A 3D depth sensor using an infrared (IR) light source adjusts IR transmittance by turning on and off a voltage applied to a transmissive optical modulator and determines a depth measurement based on a difference between transmittances. An absorption rate of the transmissive optical modulator varies depending on whether the voltage is turned on or off.

An optical modulator is used as an image-type distance sensor which photographs an object and precisely measures distances between all points in an image. Such an optical modulator may be utilized in various fields from everyday appliances to military usages, for example, an image-type distance sensor for an autonomous mobile robot, a precise measurement apparatus, safety sensors both inside and outside of vehicles, autofocusing a camera, a sensor for a security closed circuit TV (CCTV), 3D object surface recognition and printing, a broadcasting 3D camera, an endoscope 3D camera, a distance sensor for improving the accuracy of military missiles, etc.

SUMMARY

One or more exemplary embodiments may provide optical modulators capable of reducing the number of stacked distributed Bragg reflection (DBR) layers that are used as reflection layers.

Additional exemplary aspects will be set forth in part in the description which follows and, in part, will be apparent from the description, or may be learned by practice of the presented exemplary embodiments.

According to an aspect of an exemplary embodiment, an optical modulator includes: a lower reflection layer; an active layer disposed on the lower reflection layer, the active layer including a quantum well layer and a quantum barrier layer; an upper reflection layer disposed on the active layer, the upper reflection layer including a dielectric material; and a plurality of micro cavity layers disposed in the upper reflection layer.

The upper reflection layer may include a distributed Bragg reflection (DBR) layer.

The upper reflection layer may include a DBR layer comprising a plurality of layers having optical thicknesses configured to cause constructive interference with respect to light having a wavelength within a range of 780 nm to 1650 nm.

At least one of the plurality of micro cavity layers may have an optical thickness of $\lambda/2$, where $\lambda$ is a resonant wavelength of the optical modulator.

The upper reflection layer may include at least one pair of a first dielectric material layer having a first refractive index and a second dielectric material layer having a second refractive index that is different from the first refractive index.

The upper reflection layer may include a repeating stack of pairs of the first and second dielectric material layers times.

The upper reflection layer may include a first upper reflection layer, a second upper reflection layer, and a third upper reflection layer that are sequentially stacked, and the optical modulator may further include: a first micro cavity layer between the first and second upper reflection layers; and a second micro cavity layer between the second and third upper reflection layers.

At least one of the first, second, and third upper reflection layers may include at least one pair of the first and second dielectric material layers.

The first dielectric material layer and the second dielectric material layer may include materials selected from the group consisting of $SiO_2$, SiNx, indium tin oxide (ITO), indium zinc oxide (IZO), AZO, Si, amorphous silicon (a-Si), $Al_2O_3$, AlN, $HfO_2$, SiC, MgO, and $MgF_2$, and a refractive index of the first dielectric material layer may be different from a refractive index of the second dielectric material layer.

The upper reflection layer may include a first upper reflection layer, a second upper reflection layer, and a third upper reflection layer that are sequentially stacked, and the optical modulator may further include: a first micro cavity layer between the first and second upper reflection layers; and a second micro cavity layer between the second and third upper reflection layers. At least one of the first, second, and third upper reflection layers may include at least one pair of the first dielectric material layer having a first refractive index and the second dielectric material layer having a refractive index different from the first refractive index.

The lower reflection layer and the active layer may include a crystal growth layer that are formed through crystal growth by using a group III-V compound semiconductor on the substrate, and the upper reflection layer may be formed by depositing a dielectric material on the crystal growth layer.

The optical modulator may further include a metal pattern or a transparent electrode on the active layer, wherein the upper reflection layer may be formed after forming the metal pattern or the transparent electrode.

The lower reflection layer and the active layer may both be a crystal growth layers are formed through crystal growth using a group III-V compound semiconductor, the upper reflection layer may be separately formed by using a dielectric material, and the upper reflection layer may then be coupled to the crystal growth layer.

The optical modulator may further include a metal pattern or a transparent electrode on the active layer, wherein the upper reflection layer may be coupled to the crystal growth layer on which the metal pattern or the transparent electrode is formed.

The substrate may include a GaAs substrate.

The optical modulator may further include an anti-reflection coating layer on a bottom surface of the substrate.

The optical modulator according to an exemplary embodiment may reduce the total thickness of the upper reflection layer since the upper reflection layer is formed of the dielectric material.

BRIEF DESCRIPTION OF THE DRAWINGS

These and/or other exemplary aspects and advantages will become apparent and more readily appreciated from the following description of exemplary embodiments, taken in conjunction with the accompanying drawings in which.

DETAILED DESCRIPTION

Hereinafter, optical modulators including a reflection layer according to one or more exemplary embodiments will be described more fully with reference to the accompanying drawings. Like reference numerals in the drawings denote like elements. Sizes of components in the drawings may be exaggerated for convenience of explanation. In other words, since sizes and thicknesses of components in the drawings are determined merely for convenience of explanation, the following embodiments are not limited thereto. While exemplary embodiments have been particularly shown and described, it will be understood by those of ordinary skill in the art that various changes in form and details may be made therein without departing from the spirit and scope as defined by the following claims. It will be understood that when a component, such as a layer, a film, a region, or a plate, is referred to as being "on" another component, the component can be directly on the other component or intervening components may be present thereon. Expressions such as "at least one of," when preceding a list of elements, modify the entire list of elements and do not modify the individual elements of the list.

Figure 1:
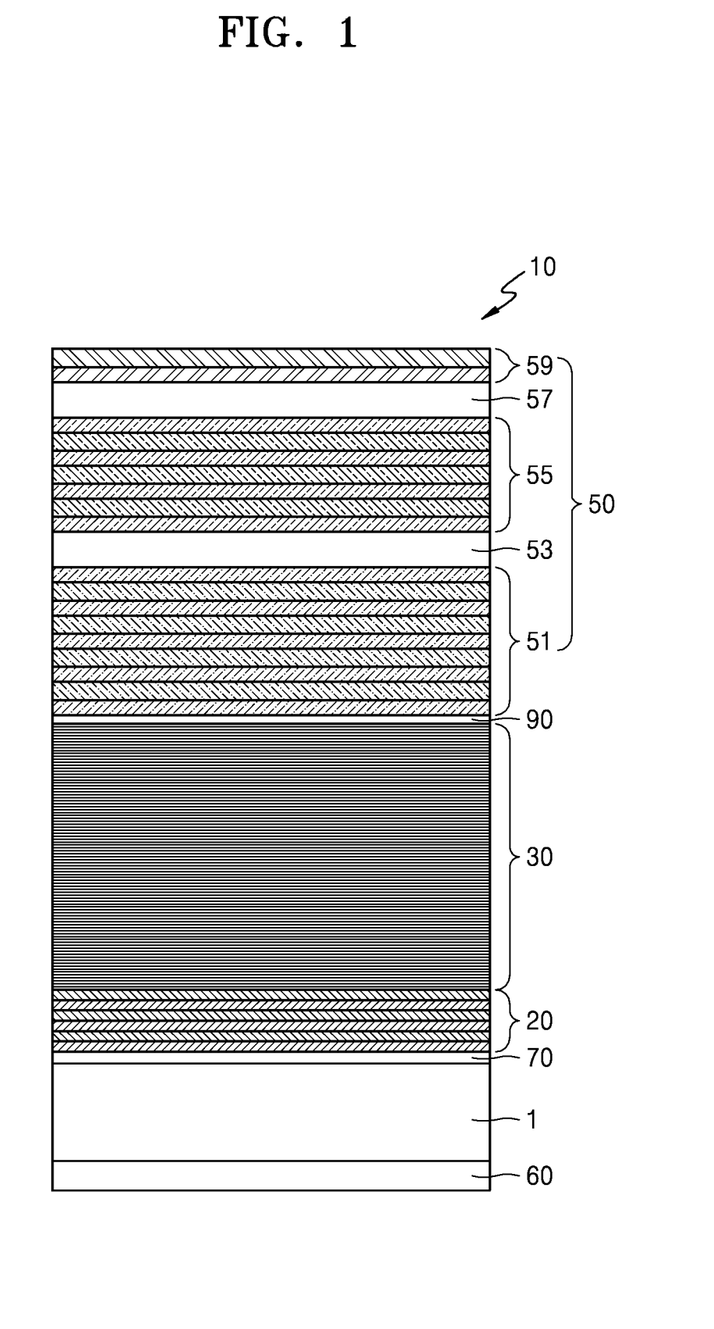
FIG. 1 is a schematic diagram of an optical modulator according to an exemplary embodiment.

FIG. 1 is a schematic diagram of an optical modulator 10 according to an exemplary embodiment.

Referring to FIG. 1, the optical modulator 10 includes a lower reflection layer 20, an active layer 30 formed on the lower reflection layer 20, an upper reflection layer 50 formed on the active layer 30, and a plurality of micro cavity layers 53 and 57 disposed within the upper reflection layer 50.

The lower reflection layer 20 and the active layer 30 may be crystal grown by using a compound semiconductor. For example, the lower reflection layer 20 and the active layer 30 may be crystal grown by using a group III-V compound semiconductor.

When the lower reflection layer 20 and the active layer 30 are crystal grown by using the compound semiconductor, a substrate 1, on which the lower reflection layer 20 and the active layer 30 are formed, may be a compound semiconductor substrate. When the optical modulator 10 is a transmissive type modulator, the substrate 1 may include a material that is transparent with respect to a target wavelength.

When a target wavelength of the optical modulator 10 is an infrared (IR) band, for example, a wavelength range of 780 nm to 1650 nm, the substrate 1 may include a material that is transparent with respect to light within a wavelength band from 780 nm to 1650 nm. For example, when the optical modulator 10 according to the exemplary embodiment is to be used with a light beam having a wavelength of 870 nm or greater, a GaAs substrate may be used as the substrate 1. For example, a light beam of a wavelength of about 940 nm may be used as illumination light, and a GaAs substrate may be used as the substrate 1. As described above, when the substrate 1 includes the material that is transparent with respect to the target wavelength, the substrate 1 may remain connected to the modulator, without being removed, even when the optical modulator 10 is a transmissive optical modulator. Alternately, the substrate 1 may be removed after manufacturing of the optical modulator 10 according to the exemplary embodiment.

The lower reflection layer 20 may be a distributed Bragg reflection (DBR) layer, in which two different layers having different refractive indexes are alternately and repeatedly stacked. The lower reflection layer 20 may include a compound consisting of, for example, Al, Ga, and As. A layer formed of an AlGaAs compound may have a refractive index that varies depending on the content amount of Al. The lower reflection layer 20 may have a structure, in which a first compound semiconductor layer and a second compound semiconductor layer including AlGaAs compounds having different Al content amounts are alternately stacked. Between the first compound semiconductor layer and the second compound semiconductor layer, one may be a high refractive index layer and the other may be a low refractive index layer. An optical thickness (that is, a value obtained by multiplying a physical thickness by the refractive index of the layer) of each of the first and second compound semiconductor layers forming the lower reflection layer 20 may be an odd-number multiple of about $\lambda/4$ ($\lambda$ being a resonant wavelength of the optical modulator 10). Thus, a reflectivity of the lower reflection layer 20 may be adjusted according to the number of stacked pairs, each including the first compound semiconductor layer and the second compound semiconductor layer. The resonant wavelength of the optical modulator 10 is a wavelength of light absorbed by the active layer 30 via resonance.

The active layer 30 is a layer configured to absorb light within the optical modulator 10, and may have a multi-quantum well structure including a quantum well layer and a quantum barrier layer. The active layer 30 may be formed by stacking the quantum well layers and the quantum barrier layers alternately and repeatedly. The active layer 30 may include at least one of InGaAs, GaAs, AlGaAs, InAlGaAs, InGaP, and GaAsP, and the quantum well layer and the quantum barrier layer may be compound semiconductor layers having compositions different from each other. For example, a combination of the quantum well layer and the quantum barrier layer may include GaAs/AlGaAs, InGaAs/

(GaAsP or InGaP or InGaAsP), InAlGaAs/(GaAsP or InGaP or InGaAsP), etc. The thickness of each quantum barrier layer in the active layer 30 may be, for example, about 2 nm to about 30 nm. In addition, the thickness of each quantum well layer in the active layer 30 may be, for example, about 4 nm to about 15 nm. The quantum well layer disposed between two quantum barrier layers may have a single-layered structure or a multi-layered structure, and may have any of various well structures.

When a reverse bias voltage is applied, a multiple quantum well structure absorbs light while generating excitons in a specific wavelength band. An absorption spectrum of the multiple quantum well structure tends to move toward long wavelengths when the reverse bias voltage increases, and accordingly, an absorption degree at a certain wavelength may vary depending on variation of the reverse bias voltage. When the active layer 30 of the optical modulator 10 has a multiple quantum well structure according to the above principle, the intensity of incident light having a certain wavelength may be modulated by adjusting the reverse bias voltage applied to the optical modulator 10.

In addition, the active layer 30 may act as a main cavity for performing Fabry-Perot resonance. To do this, the active layer 30 may have an optical thickness that is equal to about an integer multiple of $\lambda/2$.

The lower reflection layer 20 and the active layer 30 may be formed by any of various crystal growth thin film deposition methods, e.g., molecular beam epitaxy (MBE), metal-organic chemical vapor deposition (MOCVD), metal-organic vapor phase epitaxy (MOVPE), etc. For example, the lower reflection layer 20 and the active layer 30 may be manufactured to have epitaxial structures using the MOCVD method.

The upper reflection layer 50 may include a dielectric material disposed on the active layer 30. The upper reflection layer 50 formed of the dielectric material may be formed by a deposition process, after finishing an epitaxial process of the group III-V compound semiconductor for forming the lower reflection layer 20 and the active layer 30. Alternately, the upper reflection layer 50 may be separately fabricated by using the dielectric material, and then, may be coupled by, for example, a bonding process, to a crystal growth layer including the lower reflection layer 20 and the active layer 30 that are formed by the epitaxial process of the group III-V compound semiconductor.

The upper reflection layer 50 may be formed as a DBR layer by using the dielectric material. For example, the upper reflection layer 50 may be formed as a DBR layer comprising a plurality of layers having optical thicknesses configured to cause constructive interference of light within a wavelength band from about 780 nm to about 1650 nm. To do this, the upper reflection layer 50 may include at least one pair of a first dielectric material layer having a first refractive index and a second dielectric material layer having a different refractive index from the first refractive index. For example, the upper reflection layer 50 may be formed by repeatedly stacking the pair of the first and second dielectric material layers.

The first dielectric material layer and the second dielectric material layer may have refractive indexes different from each other and may include materials selected from the group consisting of $SiO_2$, $SiN_x$, ITO, IZO, AZO, Si, a-Si, $Al_2O_3$, AlN, $HfO_2$, SiC, MgO, and $MgF_2$.

For example, one of the first and second dielectric material layers may include $SiO_2$, and the other may include $TiO_2$. Also, the first dielectric material layer and the second dielectric material layer may be fabricated to have refractive indexes different from each other by using amorphous silicon (a-Si). When a growth direction of the amorphous silicon varies, the refractive index may be changed.

One of the first and second dielectric material layers may be a high refractive index layer, and the other may be a low refractive index layer. As such, in the DBR structure in which the high refractive index layer and the low refractive index layer are repeatedly stacked, reflection occurs at an interface between the two layers having different refractive indexes (that is, the high refractive index layer and the low refractive index layer), and a high reflectivity may be obtained by making phase differences between all reflected light beams equal to each other. Therefore, an optical thickness of each of the first and second dielectric material layers forming the upper reflection layer 50 may be about an odd-number multiple of $\lambda/4$. The reflectivity may be adjusted as a user desires, according to the number of stacked pairs, each including the first and second dielectric material layers.

As described above, when the upper reflection layer 50 includes the dielectric material, a difference between the refractive indexes of the first and second dielectric material layers may be greater than that in a case in which the upper reflection layer 50 is formed by using the group III-V compound semiconductor, and accordingly, the total number and an entire thickness of dielectric material layers for forming the upper reflection layer 50 may be reduced to be less than those in the case of using the group III-V compound semiconductor.

Each of the plurality of micro cavity layers 53 and 57 may be configured to perform as an additional cavity for performing Fabry-Perot resonance. To do this, at least one of the plurality of micro cavity layers 53 and 57 may have an optical thickness of about an integer multiple of $\lambda/2$ with respect to the resonance wavelength $\lambda$ of the optical modulator 10.

Each of the plurality of micro cavity layers 53 and 57 may include a material forming the high refractive index layer or the low refractive index layer forming the upper reflection layer 50. That is, the plurality of micro cavity layers 53 and 57 may be formed of the same material as that of the first or second dielectric material layer. As another example, the plurality of micro cavity layers 53 and 57 may be formed of a dielectric material that is different from that of the first and second dielectric material layers.

In the optical modulator 10 according to this exemplary embodiment, the plurality of micro cavity layers 53 and 57 may include a first micro cavity layer 53 and a second micro cavity layer 57. As described above, when the first and second micro cavity layers 53 and 57 are provided in the upper reflection layer 50, the upper reflection layer 50 may be divided into first, second, and third upper reflection layers 51, 55, and 59 by the first and second micro cavity layers 53 and 57. That is, the upper reflection layer 50 may include the first, second, and third upper reflection layers 51, 55, and 59 that are sequentially stacked. the first micro cavity layer 53 may be between the first and second upper reflection layers 51 and 55, and the second micro cavity layer 57 may be between the second and third reflection layers 55 and 59.

At least one of the first, second, and third upper reflection layers 51, 55, and 59, for example, each of the first, second, and third upper reflection layers 51, 55, and 59, may include at least one pair of the first and second dielectric material layers.

Figure 2:
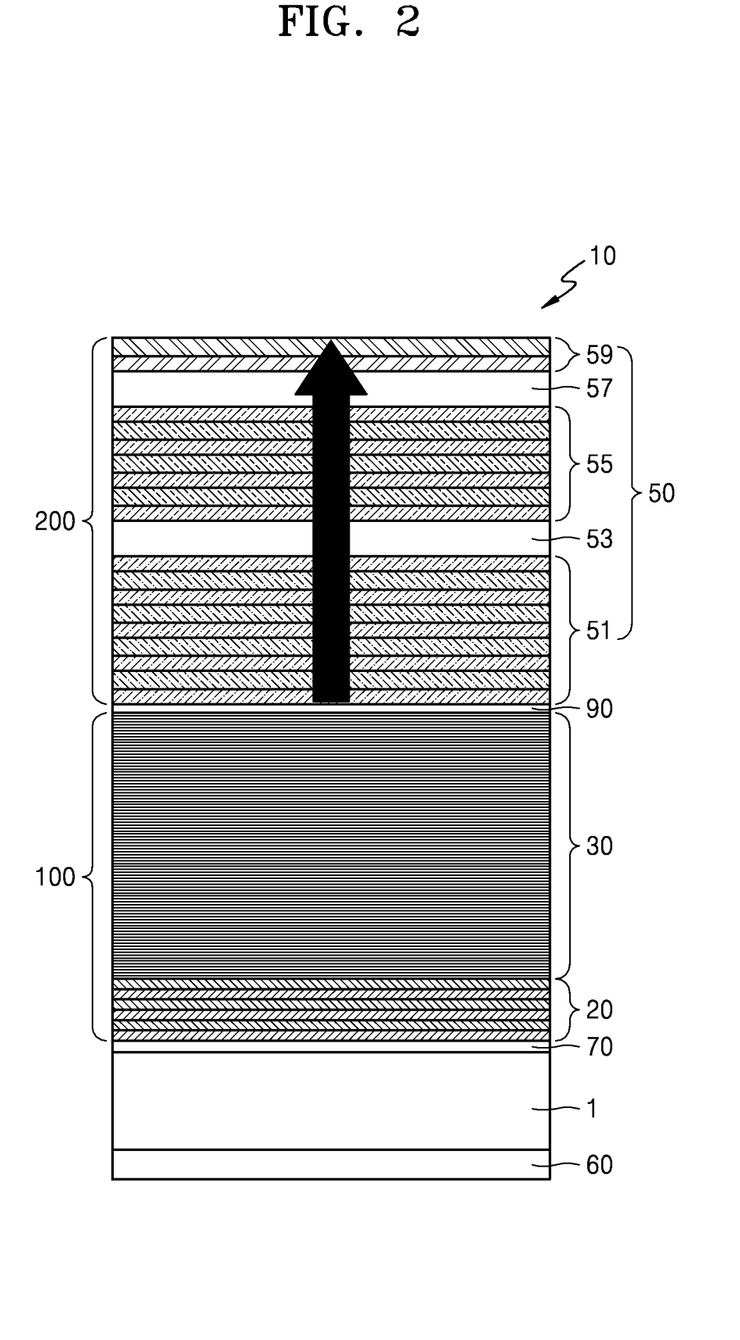
FIGS. 2 and 3 are diagrams illustrating methods of manufacturing the optical modulator of FIG. 1.
Figure 3:
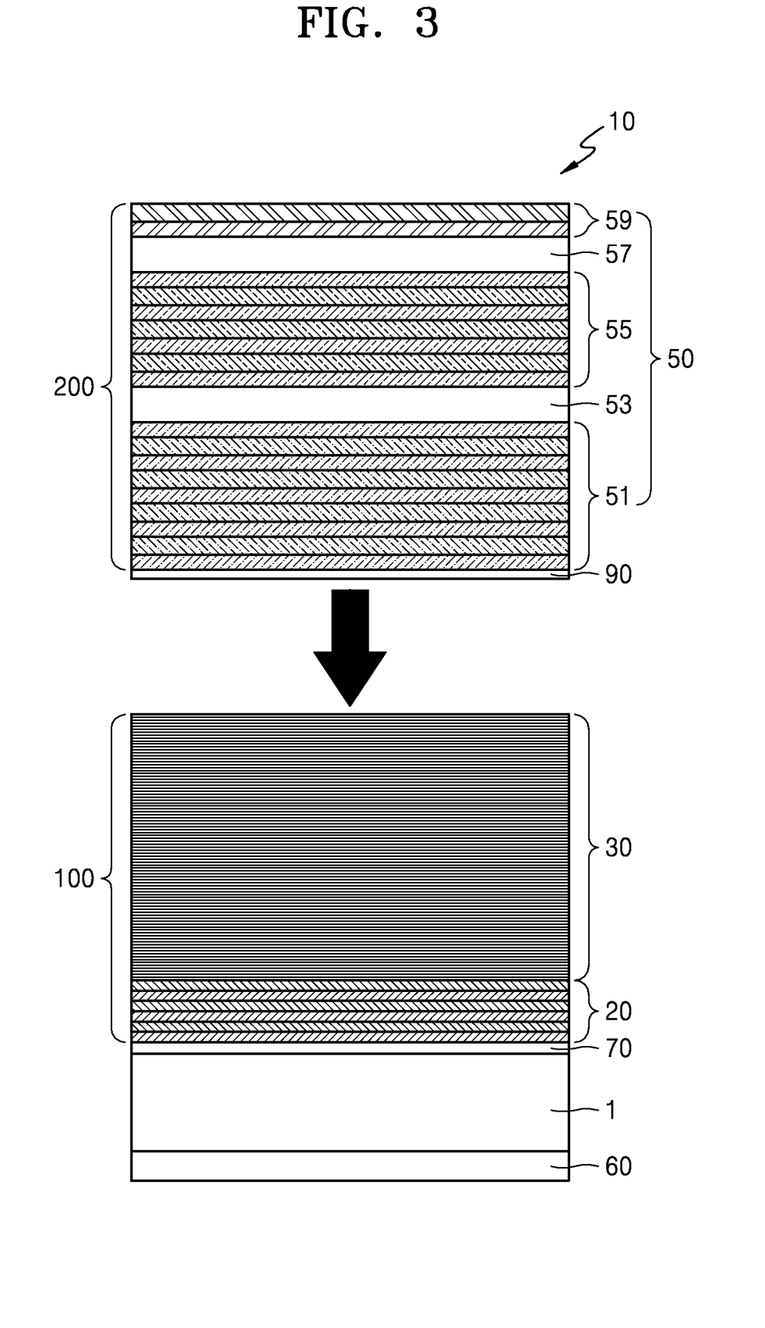

As described above, the optical modulator 10 may include the lower reflection layer 20, the active layer 30, and the upper reflection layer 50. With reference to FIG. 2, the lower reflection layer 20 and the active layer 30 may be crystal growth layers 100 formed by the crystal growth on the substrate 1 by using the group III-V compound semiconductor, and the upper reflection layer 50 may be a dielectric material layer 200 formed by depositing the dielectric material on the crystal growth layers 100. Referring to FIG. 3, the lower reflection layer 20 and the active layer 30 may be crystal growth layers 100 formed by the crystal growth on the substrate 1 by using the group III-V compound semiconductor, and the upper reflection layer 50 may be a dielectric material layer 200 formed separately by using the dielectric material. When the dielectric material layer 200 that is separately formed is coupled to the crystal growth layer 100, the optical modulator 10 may be obtained.

When a driving voltage is not applied to the optical modulator 10 having the stack structure including the lower reflection layer 20, the active layer 30, and the upper reflection layer 50 as described above, that is, during Voff, carriers are not supplied to the quantum well layer, and thus, light absorbance of the active layer 30 is not relatively large and the light transmittance of the optical modulator 10 is great. In contrast, when a driving voltage of reversed bias is applied to the optical modulator 10, that is, during Von, the carriers are supplied to the quantum well layer, and accordingly, the light absorbance of the active layer 30 is increased and the light transmittance of the optical modulator 10 is reduced.

The optical modulator 10 according to this exemplary embodiment may further include first and second electrode layers 70 and 90 so as to the reverse bias voltage to the active layer 30. For example, the optical modulator 10 may include a first electrode layer 70 between the substrate 1 and the active layer 30, and a second electrode layer 90 on the active layer 30.

The first electrode layer 70 may be formed between the substrate 1 and the lower reflection layer 20, between the lower reflection layer 20 and the active layer 30, or on a bottom surface of the substrate 1.

The second electrode layer 90 may be formed between the active layer 30 and the upper reflection layer 50, or on the upper reflection layer 50. The second electrode layer 90 may be formed as a transparent electrode. Alternatively, the second electrode layer 90 may be formed as a metal pattern so that the second electrode layer 90 may exist partially. For example, the second electrode layer 90 may be formed as a metal pattern or a transparent electrode on the active layer 30. The upper reflection layer 50 may be deposited after forming the metal pattern or the transparent electrode as the second electrode layer 90, or may be coupled to the crystal growth layer 100 including the lower reflection layer 20 and the active layer 30 on which the metal pattern or the transparent electrode is formed as the second electrode layer 90. The transparent electrode may include, for example, ITO or AZO.

FIG. 1 and the following drawings illustrate an example of a case in which the first electrode layer 70 is between the substrate 1 and the lower reflection layer 20, the second electrode layer 90 is between the active layer 30 and the upper reflection layer 50, and the first electrode 70 and the second electrode 90 are formed as transparent electrodes on an entire surface of the substrate 1 and the active layer 30, respectively.

The optical modulator 10 according to the exemplary embodiment may be formed as a transmissive optical modulator, and in this case, an anti-reflection coating layer 60 may be further formed on a bottom surface of the substrate 1.

Since the optical modulator 10 according to this exemplary embodiment includes the upper reflection layer 50 formed as DBR using a dielectric material, the total number of layers in the upper reflection layer 50 and the thickness of the upper reflection layer 50 may be reduced as compared to the case of using the group III-V compound semiconductor.

Figure 4:
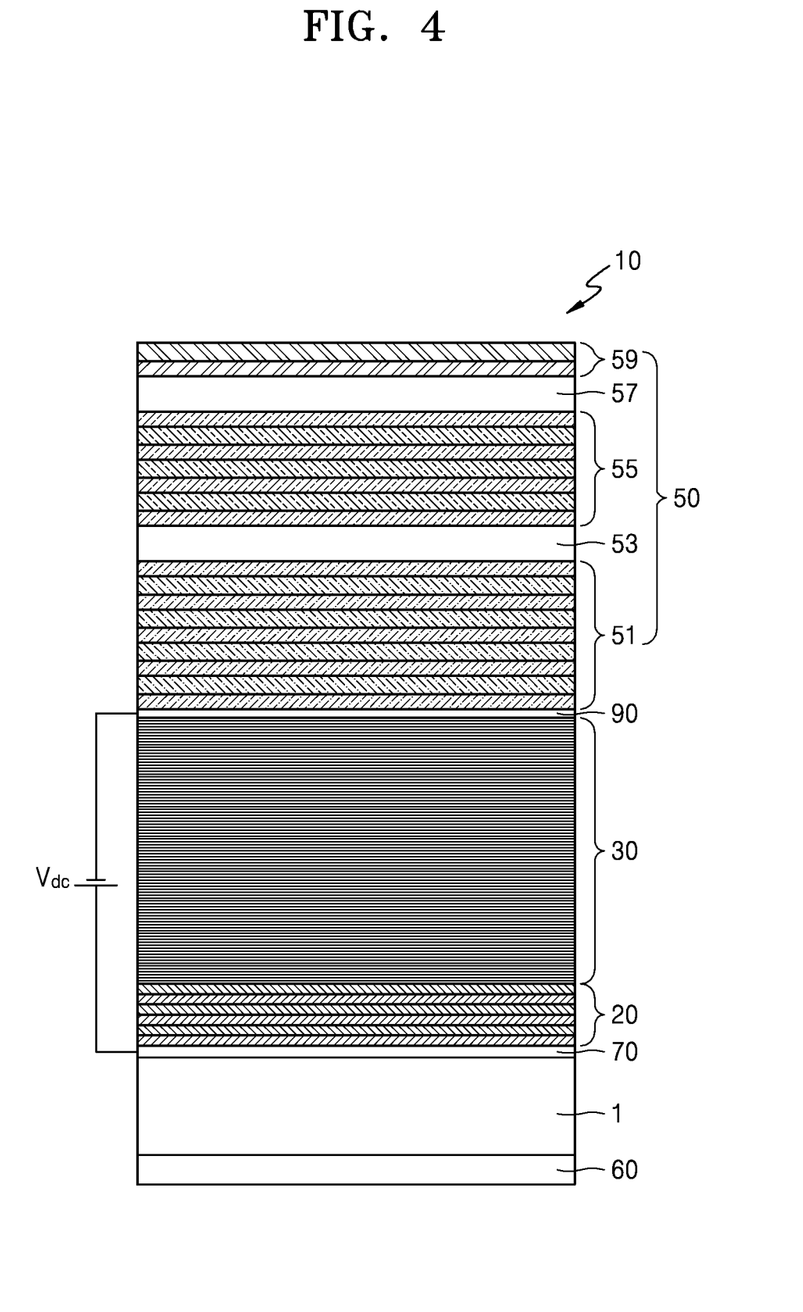
FIG. 4 is a diagram showing an example of an implementation of a transmission type of optical modulator according to an exemplary embodiment.

FIG. 4 is a diagram showing an example in which the optical modulator 10 is a transmissive type optical modulator.

Referring to FIG. 4, when the reverse bias voltage applied to the active layer 30 of the optical modulator 10 is turned on/turned off, a ratio of absorbing light incident through the upper reflection layer 50 by the active layer 30 varies, and accordingly, the intensity of the light output after passing through the lower reflection layer 20 and the substrate 1 may vary.

Figure 5:
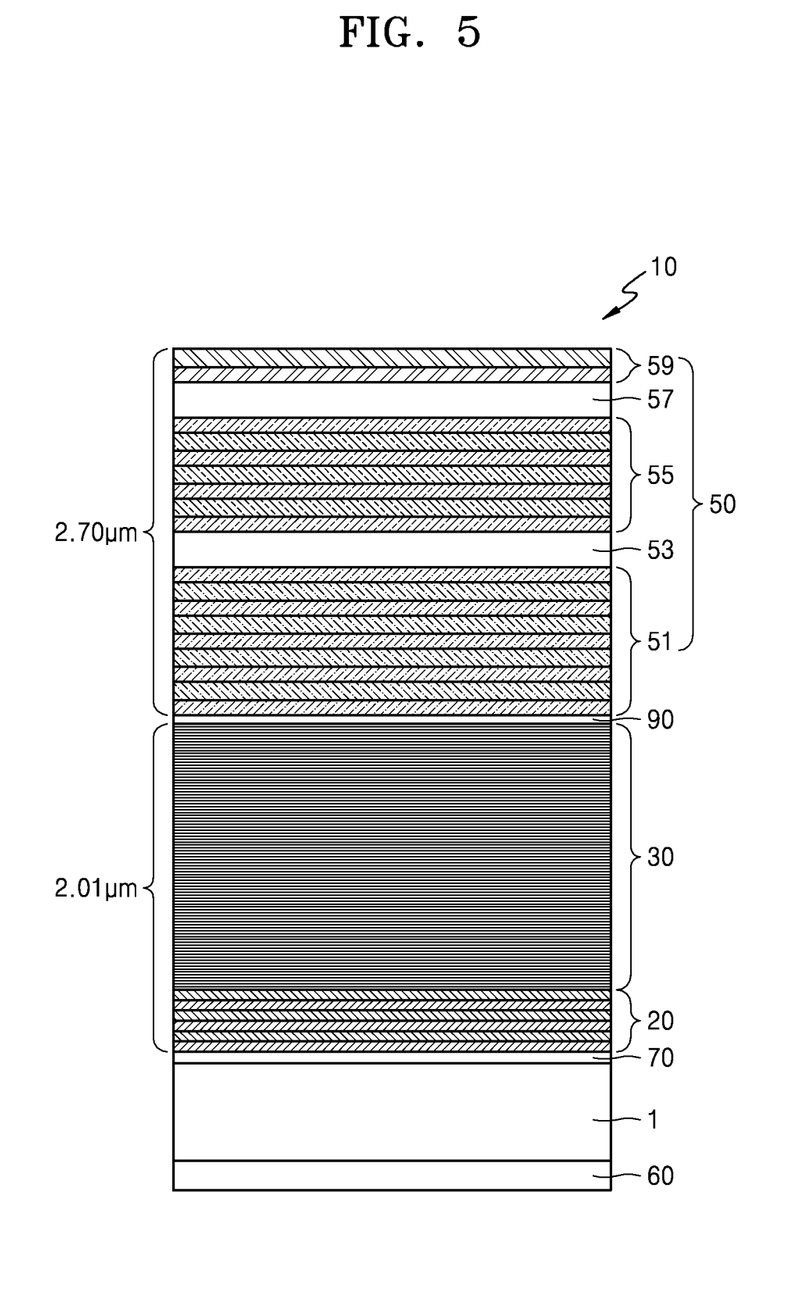
FIG. 5 is a diagram illustrating exemplary dimensions of the transmissive optical modulator of FIG. 4.

FIG. 5 is a diagram showing an example of specific exemplary dimensions of an implementation of the transmissive optical modulator 10 of FIG. 4.

Referring to FIG. 5, the crystal growth layer including the lower reflection layer 20 and the active layer 30 that are crystal grown on the substrate 1 is formed to a thickness of about 2.01 μm, and the upper reflection layer 50 is formed on the active layer 30 by using the dielectric material to a thickness of about 2.70 μm. Here, the thickness 2.70 μm of the upper reflection layer 50 includes the first and second micro cavity layers 53 and 57.

Figure 6:
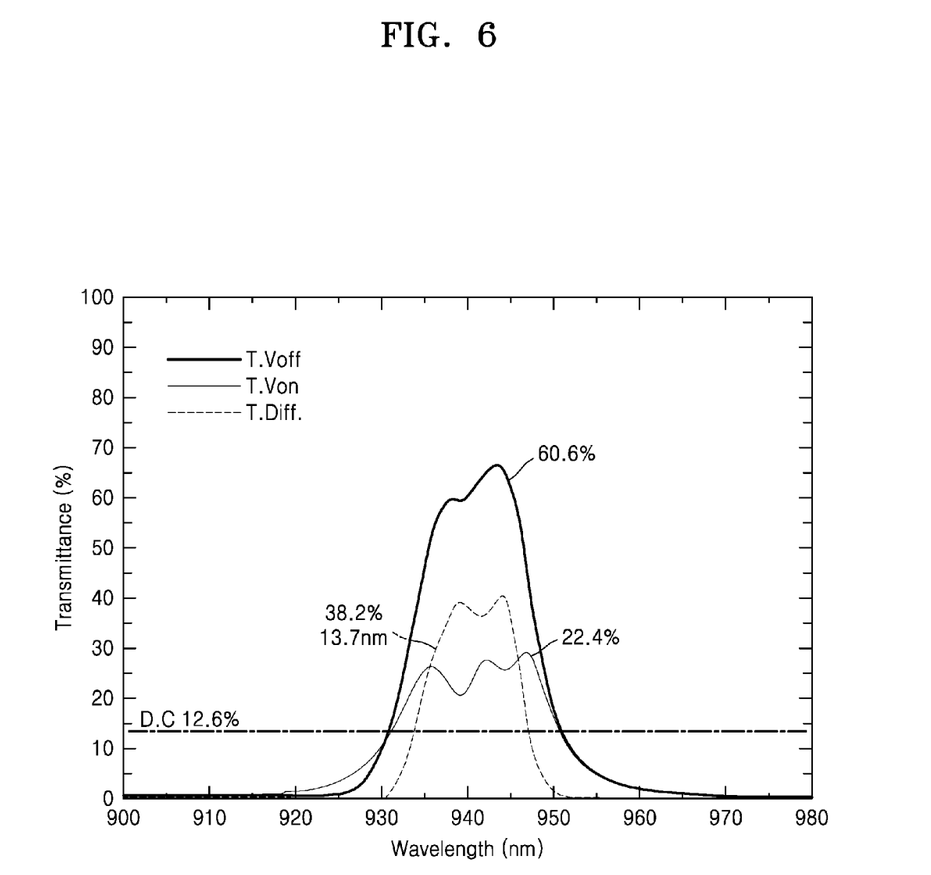
FIG. 6 is a graph showing transmittance characteristics of the transmissive optical modulator of FIG. 5.

FIG. 6 is a graph showing transmittance characteristics of the transmissive optical modulator 10 of FIG. 5.

In FIG. 6, a curve T. Voff denotes a transmittance of the optical modulator 10 when the reverse bias voltage is not applied to the active layer 30, that is, Vdc=0V, and a curve T. Von denotes a transmittance of the optical modulator when the reverse bias voltage is applied to the active layer 30, that is, Vdc>0V. Referring to the graph of FIG. 6, when the reverse bias voltage is applied to the active layer 30, light in a wavelength band around about 940 nm is absorbed, and the transmittance is greatly lower than that when the reverse bias voltage is not applied.

According to a relation between a difference T. Diff between the transmittances with respect to the wavelength band of about 940 nm when the reverse bias voltage is applied and is not applied to the active layer 30 and the bandwidth, a bandwidth representing the transmittance difference of about 38.2% is about 13.7 nm, that is, the bandwidth representing a meaningful difference between the transmittances is wide.

Figure 7:
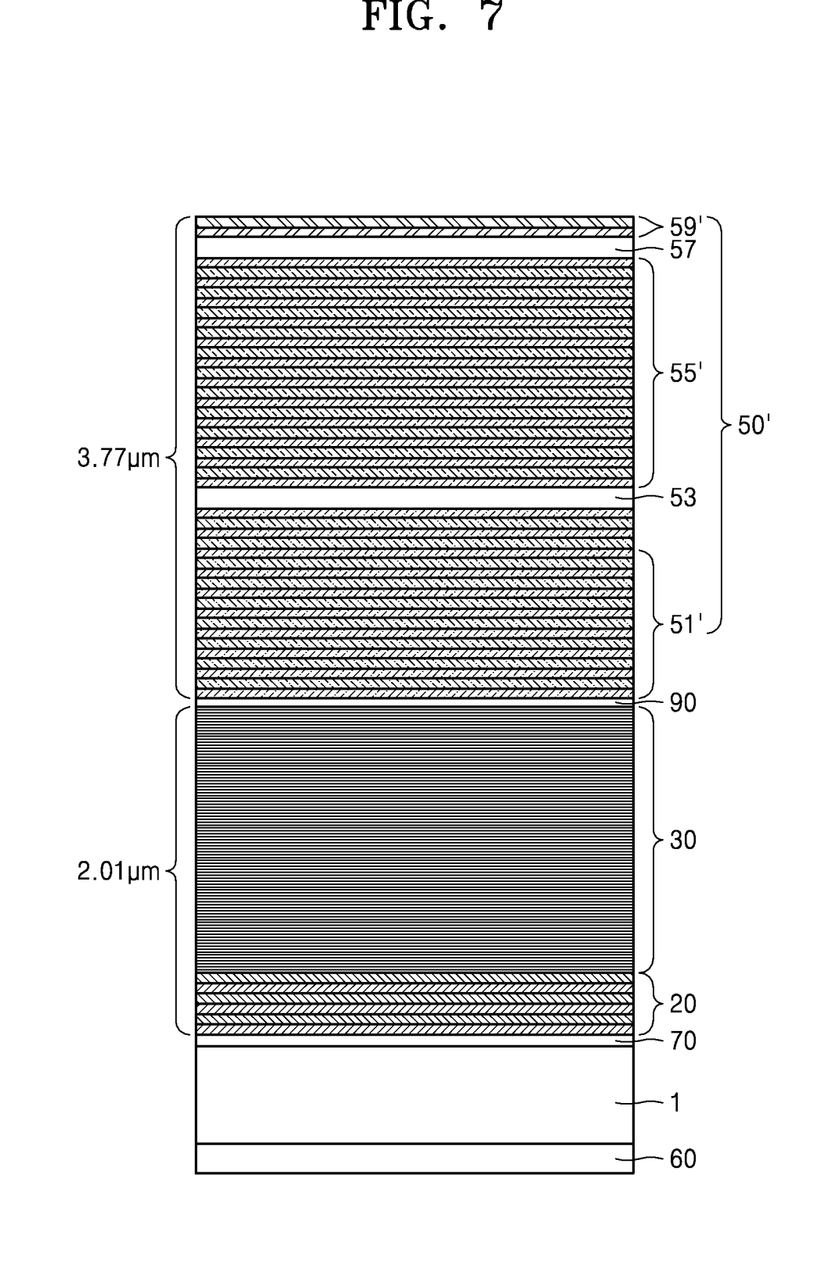
FIG. 7 is a diagram of a transmissive optical modulator according to a comparative example.
Figure 8:
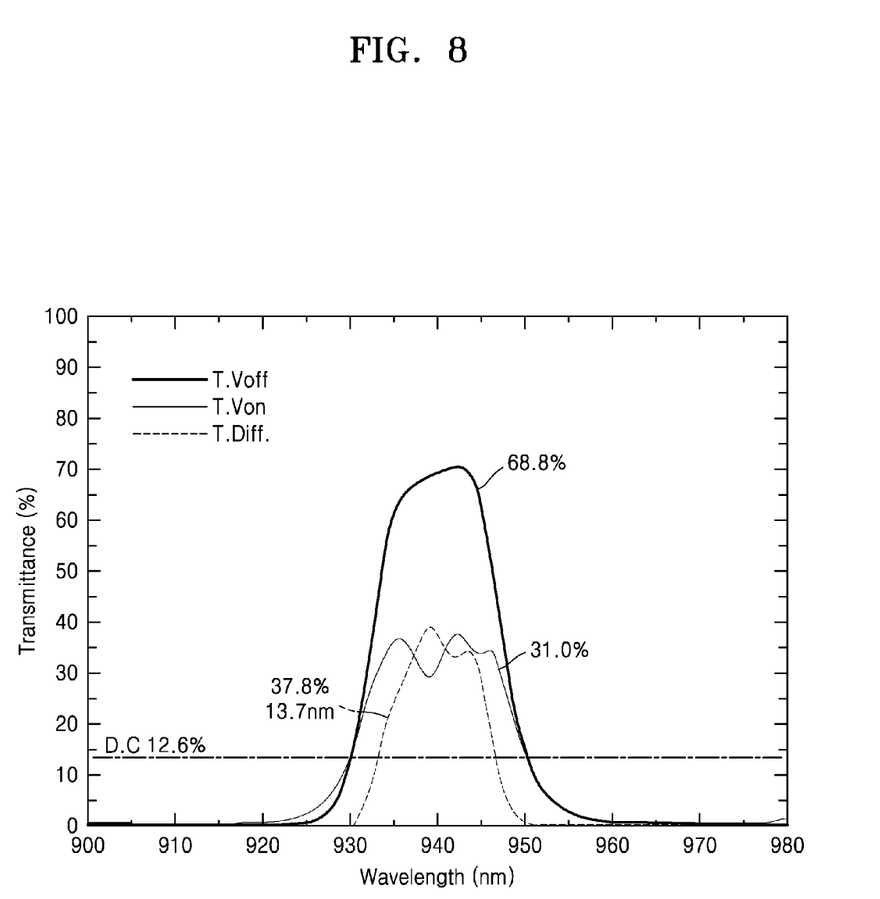
FIG. 8 is a schematic diagram showing transmittance characteristics of the transmissive optical modulator of FIG. 7.

FIG. 7 is a diagram showing a comparative example of a transmissive optical modulator, and FIG. 8 is a schematic diagram showing transmittance characteristics of the transmissive optical modulator of FIG. 7.

The transmissive optical modulator of FIG. 7 according to the comparative example is the same as the transmissive optical modulator 10 illustrated in the exemplary embodiment of FIG. 5, except that an upper reflection layer 50' includes the group III-V compound semiconductor. Here, in FIG. 7, first, second, and third upper reflection layers 51', 55', and 59' of the upper reflection layer 50' may each include at least one pair of a first compound semiconductor layer and a second compound semiconductor layer having different refractive indexes from each other. The first and second micro cavity layers 53 and 57 in the upper reflection layer 50' are comparable to the first and second micro cavity layers 53 and 57 shown in FIG. 5 in their materials, thicknesses, and optical distances from the active layer 30.

Referring to FIG. 8, in the transmissive optical modulator according to the comparative example of FIG. 7, according to a relation between a difference T. Diif between the transmittances with respect to the wavelength band of 940 nm when the reverse bias voltage is applied and is not applied and the bandwidth, the bandwidth representing the transmittance difference of about 37.8% is about 13.7 nm, which is similar to the transmittance difference at the same wavelength as the case of FIG. 6.

In order to manufacture the transmissive optical modulator according to the comparative example to show the similar transmittance difference at the same bandwidth as that of the transmissive optical modulator 10 of FIG. 5, an entire thickness of the upper reflection layer 50' must be much greater than that of the transmissive optical modulator 10 as shown in FIG. 7. That is, the entire thickness of the upper reflection layer 50 is about 2.70 μm according to the transmissive optical modulator 10 according to the exemplary embodiment, whereas the entire thickness of the upper reflection layer 50' is about 3.77 μm according to the comparative example which shows a similar transmittance difference as that of the exemplary embodiment. This is because, if the first, second, and third upper reflection layers 51', 55', and 59' of the upper reflection layer 50' are formed through the crystal growth by using the compound semiconductor like the lower reflection layer 20, the difference between the refractive index of the first and second compound semiconductor layers is less than that of the dielectric materials, and thus, more pairs of the first and second compound semiconductor layers for the upper reflection layer 50' are necessary in order to obtain the reflectivity that is equal to the upper reflection layer 50 of the transmissive optical modulator 10 according to the exemplary embodiment. Here, the thickness of the upper reflection layer 50' according to the comparative example, that is, about 3.77 μm, includes the first and second micro cavity layers 53 and 57.

Therefore, when the upper reflection layer 50 includes the dielectric material as in the optical modulator 10 according to the exemplary embodiment, the entire thickness of the upper reflection layer 50 representing the desired transmittance difference may be reduced, and accordingly, a time duration taken to manufacture the optical modulator 10 and processing unit costs may also be reduced. Also, when the upper reflection layer 50 includes the dielectric material, unit costs of the material used to form the upper reflection layer 50 and entire processing difficulty of the optical modulator 10 may be reduced.

The optical modulator 10 according to the above exemplary embodiments may be utilized in a 3D camera.

A 3D camera requires an ability to measure distances from a plurality of points on an object to the 3D camera itself, in addition to a photographing function. Various algorithms are suggested for measuring distances from the object to the 3D camera, and a time-of-flight (TOF) method is typically used. The TOF method is a method of irradiating illumination light onto an object and measuring a flight time of the illumination light reflected from the object from the time the light is output until a light receiver receives the reflected light. The flight time of the illumination light may be obtained by measuring a phase delay of the illumination light, and the optical modulator may be used to measure the phase delay accurately.

For example, a 3D camera using the TOF method uses an infrared ray as the illumination light. When light having a wavelength band of about 870 nm or greater, which may be transmitted through the GaAs substrate, for example, light having a wavelength band of about 940 nm, is used as the illumination light in the 3D camera using the TOF method, the optical modulator 10 may be used as a high speed optical modulator for measuring the phase delay accurately.

The optical modulator 10 according to the one or more exemplary embodiments may be utilized in a 3D display, as well as in a 3D camera. It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. An optical modulator comprising:
a lower reflection layer;
an active layer disposed on the lower reflection layer, the active layer comprising a quantum well layer and a quantum barrier layer;
an upper reflection layer disposed on the active layer, the upper reflection layer comprising a dielectric material; and
a plurality of micro cavity layers disposed in the upper reflection layer.

2. The optical modulator of claim 1, wherein the upper reflection layer comprises a distributed Bragg reflection (DBR) layer.

3. The optical modulator of claim 2, wherein the upper reflection layer comprises a DBR layer comprising a plurality of layers having optical thicknesses configured to cause constructive interference with respect to light having a wavelength within a range of 780 nm to 1650 nm.

4. The optical modulator of claim 3, wherein at least one of the plurality of micro cavity layers has an optical thickness of $\lambda/2$, where $\lambda$ is a resonant wavelength of the optical modulator.

5. The optical modulator of claim 1, wherein the upper reflection layer comprises at least one pair of a first dielectric material layer having a first refractive index and a second dielectric material layer having a second refractive index different from the first refractive index.

6. The optical modulator of claim 5, wherein the upper reflection layer comprises a repeating stack of pairs of the first dielectric material layer and the second dielectric material layer.

7. The optical modulator of claim 5, wherein the upper reflection layer comprises a first upper reflection layer, a second upper reflection layer, and a third upper reflection layer that are sequentially stacked, and the optical modulator further comprises:
a first micro cavity layer between the first upper reflection layer and the second upper reflection layer; and
a second micro cavity layer between the second upper reflection layer and the third upper reflection layer.

8. The optical modulator of claim 7, wherein at least one of the first upper reflection layer, the second upper reflection layer, and the third upper reflection layer comprises at least one pair of the first dielectric material layer and the second dielectric material layer.

9. The optical modulator of claim 5, wherein the first dielectric material layer and the second dielectric material layer each comprise at least one material selected from a group consisting of $SiO_2$, SiNx, indium tin oxide (ITO), indium zinc oxide (IZO), AZO, Si, amorphous silicon (a-Si), Al$_2$O$_3$, AlN, HfO$_2$, SiC, MgO, and MgF$_2$, and wherein a refractive index of the first dielectric material layer is different from a refractive index of the second dielectric material layer.

10. The optical modulator of claim 1, wherein the upper reflection layer comprises a first upper reflection layer, a second upper reflection layer, and a third upper reflection layer that are sequentially stacked, and the optical modulator further comprises:
   a first micro cavity layer between the first upper reflection layer and the second upper reflection layer; and
   a second micro cavity layer between the second upper reflection layer and the third upper reflection layer.

11. The optical modulator of claim 10, wherein at least one of the first upper reflection layer, the second upper reflection layer, and the third upper reflection layer comprises at least one pair of the first dielectric material layer having a first refractive index and the second dielectric material layer having a second refractive index different from the first refractive index.

12. The optical modulator of claim 11, wherein the first dielectric material layer and the second dielectric material layer each comprise at least one material selected from a group consisting of SiO$_2$, SiNx, indium tin oxide (ITO), indium zinc oxide (IZO), AZO, Si, amorphous silicon (a-Si), Al$_2$O$_3$, AlN, HfO$_2$, SiC, MgO, and MgF$_2$, and wherein a refractive index of the first dielectric material layer is different from a refractive index of the second dielectric material layer.

13. The optical modulator of claim 1, wherein the lower reflection layer and the active layer each comprise a crystal growth layer that are formed through crystal growth by disposing a group III-V compound semiconductor on the substrate, and the upper reflection layer is formed by depositing a dielectric material on the crystal growth layer.

14. The optical modulator of claim 13, further comprising one of a metal pattern and a transparent electrode disposed on the active layer,
   wherein the upper reflection layer is formed after forming the one of the metal pattern and the transparent electrode.

15. The optical modulator of claim 13, further comprising an anti-reflection coating layer on a bottom surface of the substrate.

16. The optical modulator of claim 1, wherein the lower reflection layer and the active layer each comprise a crystal growth layer formed of a group III-V compound semiconductor on the substrate, the upper reflection layer is formed separately by using a dielectric material, and the upper reflection layer is coupled to the crystal growth layer.

17. The optical modulator of claim 16, further comprising one of a metal pattern and a transparent electrode disposed on the active layer,
   wherein the upper reflection layer is coupled to the crystal growth layer on which the one of the metal pattern and the transparent electrode is formed.

18. The optical modulator of claim 16, further comprising an anti-reflection coating layer on a bottom surface of the substrate.

19. The optical modulator of claim 1, wherein the substrate comprises GaAs.

20. An optical modulator comprising:
   a lower reflection layer;
   an active layer disposed on the lower reflection layer; and
   an upper reflection layer disposed on the active layer, wherein the upper reflection layer comprises a dielectric material and has a thickness of not greater than 2.7 μm, and wherein the upper reflection layer comprises a plurality of microcavity layers disposed therewithin.

* * * * *